(12) United States Patent
Weiss et al.

(10) Patent No.: US 7,887,874 B2
(45) Date of Patent: Feb. 15, 2011

(54) FULLY AUTOMATED PASTE DISPENSE SYSTEM FOR DISPENSING SMALL DOTS AND LINES

(75) Inventors: Thomas Weiss, Poughkeepsie, NY (US); James N Humenik, LaGrangeville, NY (US); Mark J LaPlante, Montgomery, NY (US); David C Long, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 179 days.

(21) Appl. No.: 11/931,153

(22) Filed: Oct. 31, 2007

(65) Prior Publication Data

US 2008/0057180 A1   Mar. 6, 2008

Related U.S. Application Data

(62) Division of application No. 10/645,384, filed on Aug. 21, 2003.

(51) Int. Cl.
*C23C 16/52* (2006.01)
*G05B 11/01* (2006.01)
*B65H 3/08* (2006.01)
*G06K 9/00* (2006.01)

(52) U.S. Cl. .............................. 427/8; 700/19; 700/17; 221/278; 382/150

(58) Field of Classification Search ................... 700/19, 700/17; 427/8; 221/278; 382/150
See application file for complete search history.

(56) References Cited

U.S. PATENT DOCUMENTS 3,334,354 A    8/1967 Mutschler (Continued)

FOREIGN PATENT DOCUMENTS

EP    717428 A2 * 6/1996

(Continued)

OTHER PUBLICATIONS

Hamburgen, W.R. "Precise robotic paste dot dispensing", Electronic Components Conference, 1989, May 22-24, 1989 pp. 593-602.*

(Continued)

*Primary Examiner*—Albert Decady
*Assistant Examiner*—Jason Lin
(74) *Attorney, Agent, or Firm*—DeLio & Peterson, LLC; Peter W. Peterson (57) ABSTRACT

A method of dispensing a flowable conductive paste onto a greensheet from a dispensing apparatus comprising an orifice member having first and second surfaces and a bore therethrough between the surfaces, a pressurized chamber adjacent the orifice member first surface containing the paste, and a punch having a face movable through the orifice member bore. The method comprises positioning the punch outside the orifice member bore such that the punch face is spaced from the orifice member first surface, flowing a desired amount of paste onto the punch face, moving the paste on the punch face through the orifice member bore until the punch face extends beyond the orifice member second surface, and contacting the workpiece with the paste while still on the punch face to deposit the paste on the greensheet. The method then provides for retracting the punch until the punch face is substantially coplanar with the orifice member second surface, and then cleaning the punch face and coplanar orifice member second surface to remove any residual paste thereon.

10 Claims, 6 Drawing Sheets

U.S. PATENT DOCUMENTS

| | | | |
|---|---|---|---|
| 4,646,676 A | 3/1987 | Kidder et al. | |
| 4,704,305 A | 11/1987 | Berger et al. | |
| 4,784,582 A | 11/1988 | Howseman, Jr. | |
| 4,942,984 A | 7/1990 | Miller | |
| 4,942,998 A | 7/1990 | Horvath et al. | |
| 5,186,982 A * | 2/1993 | Blette et al. | 427/98.4 |
| 5,558,842 A | 9/1996 | Vassiliou et al. | 422/108 |
| 5,565,262 A * | 10/1996 | Azzaro et al. | 428/210 |
| 5,834,062 A | 11/1998 | Johnson et al. | |
| 6,045,615 A * | 4/2000 | Buechele et al. | 118/300 |
| 6,063,339 A * | 5/2000 | Tisone et al. | 422/67 |
| 6,093,251 A | 7/2000 | Carr et al. | |
| 6,220,075 B1 * | 4/2001 | Papen et al. | 73/1.74 |
| 6,269,194 B1 * | 7/2001 | Nichani | 382/270 |
| 6,361,831 B1 | 3/2002 | Sato et al. | |
| 6,503,831 B2 * | 1/2003 | Speakman | 438/674 |
| 6,549,293 B2 * | 4/2003 | Hofman | 356/635 |
| 6,605,315 B1 * | 8/2003 | Ozono et al. | 438/118 |
| 6,761,925 B2 | 7/2004 | Banno et al. | |
| 6,775,879 B2 | 8/2004 | Bibeault et al. | |
| 6,814,804 B2 * | 11/2004 | Onishi et al. | 118/213 |
| 6,866,881 B2 | 3/2005 | Prentice et al. | |
| 6,899,289 B2 * | 5/2005 | McCracken et al. | 239/461 |
| 6,915,928 B2 | 7/2005 | Brooks | |
| 6,998,230 B1 * | 2/2006 | Schantz et al. | 435/6 |
| 7,121,642 B2 * | 10/2006 | Stoessel et al. | 347/19 |
| 7,270,712 B2 * | 9/2007 | Edwards et al. | 118/669 |
| 2001/0009136 A1 | 7/2001 | Bryning et al. | |
| 2001/0043864 A1 * | 11/2001 | Maruyama et al. | 417/44.1 |
| 2002/0020350 A1 * | 2/2002 | Prentice et al. | 118/669 |
| 2002/0037372 A1 | 3/2002 | Sato et al. | |
| 2002/0088269 A1 * | 7/2002 | Cavallaro et al. | 73/1.47 |
| 2003/0010287 A1 * | 1/2003 | Banno et al. | 118/688 |
| 2003/0032064 A1 * | 2/2003 | Soller et al. | 435/7.1 |
| 2003/0119193 A1 | 6/2003 | Hess et al. | |
| 2003/0137080 A1 * | 7/2003 | Bouras et al. | 264/272.11 |
| 2003/0161939 A1 * | 8/2003 | Kweon et al. | 427/8 |
| 2004/0027405 A1 * | 2/2004 | Stoessel et al. | 347/19 |
| 2004/0039532 A1 * | 2/2004 | Bass | 702/19 |
| 2004/0251314 A1 * | 12/2004 | Schramm et al. | 239/102.1 |

FOREIGN PATENT DOCUMENTS

| | | | |
|---|---|---|---|
| JP | 2002016090 A * | 1/2002 | |
| JP | 2002110033 A | 4/2002 | |
| JP | 2002166225 A | 6/2002 | |
| JP | 2003317225 A | 11/2003 | |
| JP | 2007051605 A | 3/2007 | |

OTHER PUBLICATIONS

F.W. Chapin, "Solder Paste Application", IBM Technical Disclosure Bulletin, vol. 15, No. 4, Sep. 1972, p. 1236.

* cited by examiner

FULLY AUTOMATED PASTE DISPENSE SYSTEM FOR DISPENSING SMALL DOTS AND LINES

BACKGROUND OF THE INVENTION

1. Field of the Invention

The present invention relates to a paste dispensing system and in particular to a mechanically assisted paste dispense apparatus and method for dispensing small dots and lines of conductive paste on ceramic greensheets utilized in microelectronic circuits.

2. Description of Related Art

Ceramic greensheets are employed in the production of microelectronic integrated circuit devices. Such greensheets are typically personalized by depositing conductive paste in the form of lines using masks. Yield losses for glass ceramic greensheet product often exceed 30%, and conductive paste may be deposited on the surface in order to repair either line voids or partially filled vias. Prior art methods have included using a very fine brush e.g., using one hair, and dipping it into a reservoir of paste and using a microscope, transferring the paste into the line void on the greensheet. Other dispenser systems on the market rely only on pressure and positive displacement to squeeze conductive paste from dispense nozzles. Such systems suffer from clogging problems when sized to dispense small dots of conductive paste. These systems also produce inconsistent dot sizes. As lines get narrower, i.e., less than 50 microns, the ability to perform this type of repair manually using brushes or by paste dispensing equipment becomes more difficult, if not impossible.

SUMMARY OF THE INVENTION

Bearing in mind the problems and deficiencies of the prior art, it is therefore an object of the present invention to provide an improved method and apparatus for dispensing conductive paste of other flowable materials onto a work piece such as a ceramic greensheet.

It is another object of the present invention to provide a method and apparatus for dispensing flowable paste which enables smaller size dots or lines of paste to be created on the greensheet.

A further object of the present invention is to provide a method and apparatus for dispensing a conductive paste which reduces the problems of clogged nozzles.

It is yet another object of the present invention to provide a method and apparatus for dispensing conductive paste which provides for controllable and repeatable dot sizes.

The above and other objects and advantages, which will be apparent to one of skill in the art, are achieved in the present invention which is directed to, in a first aspect, a method of dispensing a flowable material onto a workpiece from a dispensing apparatus comprising an orifice member having first and second surfaces and a bore therethrough between the surfaces, a pressurized chamber adjacent the orifice member first surface for flowable material, and a punch having a face movable through the orifice member bore. The method comprises providing a flowable material in the chamber, and positioning the punch outside the orifice member bore such that the punch face is spaced from the orifice member first surface. The method then includes flowing a desired amount of flowable material onto the punch face, moving the punch and desired amount of flowable material on the punch face through the orifice member bore until the punch face extends beyond the orifice member second surface, and contacting the workpiece with the desired amount of flowable material while still on the punch face. Preferably, the orifice member lower surface does not contact the workpiece. The method then provides for depositing the desired amount of flowable material onto the workpiece and retracting the punch until the punch face is substantially coplanar with the orifice member second surface.

Optionally, after the punch face is substantially coplanar with the orifice member second surface, the method may further include cleaning the punch face and coplanar orifice member second surface to remove any residual flowable material thereon.

Preferably, the chamber has larger diameter than the orifice member bore. The punch preferably creates a sliding seal fit inside the orifice member bore, such that the step of retracting the punch until the punch face is substantially coplanar with the orifice member second surface simultaneously seals the bore and chamber. In its preferred embodiment, the flowable material is a conductive, adhesive paste and the workpiece is a ceramic greensheet. The orifice member bore diameter is preferably less than 72 µm, such that the flowable material may be deposited with a diameter less than 50 µm, and with a volume of less than 50 picoliters.

The flowable material may be pressurized in the chamber to flow the desired amount of flowable material onto the punch face, without forcing the flowable material out through the orifice member bore, when the punch is positioned outside the orifice member bore and the punch face is spaced from the orifice member first surface.

The method may continuously repeat the depositing of the desired amount of flowable material onto the workpiece a plurality of times, and may repeat the depositing of the desired amount of flowable material onto a previously deposited amount of flowable material to create a desired height of flowable material on the workpiece.

In the preferred embodiment where the flowable material is a conductive paste and the workpiece is a ceramic greensheet, the method may include depositing the desired amount of flowable conductive paste into a via opening in the greensheet, and/or repeatedly depositing desired amounts of flowable conductive paste adjacent previously deposited amounts of flowable material to create a line of conductive paste on the ceramic greensheet.

While continuously repeating the flowing of the flowable material onto the punch face and the depositing of the flowable material onto the workpiece, the method may further include: i) simultaneously adjusting the spacing of the punch face from the orifice member first surface to adjust the desired amount of flowable material on the punch face, ii) simultaneously adjusting the distance the punch face extends beyond the orifice member second surface to adjust the diameter of the desired amount of flowable material deposited onto the workpiece, and/or iii) simultaneously measuring size of the flowable material deposited onto the workpiece and using the size measurement to adjust the distance the punch face extends beyond the orifice member second surface and the size of the desired amount of flowable material deposited onto the workpiece.

The method may further include measuring the distance of the workpiece to the orifice member second surface and, using the distance measurement, adjusting the distance the punch face extends beyond the orifice member second surface and the diameter of the desired amount of flowable material deposited onto the workpiece.

Prior to extending the punch face beyond the orifice member second surface and depositing the desired amount of flowable material onto the workpiece, the method may include repeatedly moving the punch from a position outside the orifice member bore, where the punch face is spaced from the orifice member first surface, through the orifice member bore to a position where the punch face is substantially coplanar with the orifice member second surface.

In another aspect, the present invention is directed to a method of dispensing a conductive paste onto a ceramic greensheet comprising initially providing a dispensing apparatus comprising an orifice member having first and second surfaces and a bore therethrough between the surfaces, a chamber adjacent the orifice member first surface for conductive paste, and a punch having a face movable through the orifice member bore, and providing conductive paste in the chamber. The method then includes positioning the punch outside the orifice member bore such that the punch face is spaced from the orifice member first surface, and then depositing the desired amount of conductive paste onto the greensheet by flowing a desired amount of conductive paste onto the punch face. The method then comprises moving the punch and desired amount of conductive paste on the punch face through the orifice member bore until the punch face extends beyond the orifice member second surface, contacting the greensheet with the desired amount of conductive paste while still on the punch face, and transferring the desired amount of conductive paste onto the greensheet in the form of a dot. The method then includes depositing additional desired amounts of conductive paste onto the greensheet in the form of separate, spaced-apart dots, calibrating size of the dots of conductive paste applied onto the greensheet by measuring the size of the dots, and adjusting parameters for dispensing the conductive paste onto the greensheet based on measurements of the size of the dots. The method also includes retracting the punch until the punch face is substantially coplanar with the orifice member second surface.

Preferably, after the punch face is substantially coplanar with the orifice member second surface, the method further includes cleaning the punch face and coplanar orifice member second surface to remove any residual flowable material thereon.

In calibrating size of the dots of conductive paste, the method may further include determining rate of change of the size of the dots on the greensheet, determining average size of the dots on the greensheet, and determining difference in size between dots on the greensheet. In such case, adjusting parameters for dispensing the conductive paste onto the greensheet may be based on one or more of the determinations of rate of change of the size of the dots, average size of the dots and difference in size between smallest and largest dots on the greensheet. The method may further include assigning a calibration score based on the determinations of rate of change of the size of the dots, average size of the dots and difference in size between smallest and largest dots on the workpiece surface.

In yet another aspect, the present invention provides an apparatus for dispensing a flowable material onto a workpiece comprising an orifice member having first and second surfaces and a bore therethrough between the surfaces, a chamber adjacent the orifice member first surface for flowable material, a punch having a face movable through the orifice member bore, and a support for supporting a workpiece a desired distance from the orifice member second surface. The apparatus also includes a control system for operating the punch. The control system is adapted to position the punch outside the orifice member bore such that the punch face is spaced from the orifice member first surface, flow a desired amount of flowable material onto the punch face, move the punch and desired amount of flowable material on the punch face through the orifice member bore until the punch face extends beyond the orifice member second surface, contact the workpiece with the desired amount of flowable material while still on the punch face, deposit the desired amount of flowable material onto the workpiece, and retract the punch until the punch face is substantially coplanar with the orifice member second surface. The positioning of the punch face in this manner permits cleaning of the punch face and coplanar orifice member second surface to remove any residual flowable material thereon.

The apparatus preferably further includes a sensor for measuring the size of the amount of flowable material deposited onto the workpiece, and a calibration system for calibrating size of dots of flowable material applied onto the workpiece by adjusting parameters for dispensing the flowable material onto the workpiece based on measurements of the size of the dots by the sensor. When the apparatus includes such a sensor, the control system may be adapted to use the deposited flowable material size measurement to adjust the spacing of the punch face from the orifice member first surface to adjust the desired amount of flowable material on the punch face and the size of the desired amount of flowable material subsequently deposited onto the workpiece. More preferably, the apparatus includes a first sensor for measuring the distance of the workpiece to the orifice member second surface and a second sensor for measuring the size of the amount of flowable material deposited onto the workpiece. The control system may be adapted to use the workpiece distance measurement and the deposited flowable material size measurement to adjust the distance the punch face extends beyond the orifice member second surface and the size of the desired amount of flowable material subsequently deposited onto the workpiece.

A further aspect of the present invention provides a method of calibrating size of flowable material dots applied onto a workpiece surface comprising dispensing flowable material in the form of separate, spaced-apart dots onto a workpiece surface, measuring the size of the dots on the workpiece surface, determining rate of change of the size of the dots on the workpiece surface, determining average size of the dots on the workpiece surface, and determining difference in size between dots on the workpiece surface. The method then includes adjusting parameters for dispensing the flowable material onto the workpiece surface based on one or more of the determinations of rate of change of the size of the dots, average size of the dots and difference in size between smallest and largest dots on the workpiece surface. Preferably, the method assigns a calibration score based on the determinations of rate of change of the size of the dots, average size of the dots and difference in size between smallest and largest dots on the workpiece surface.

In a related aspect, the present invention provides an article of manufacture comprising a computer-usable medium having computer readable program code means embodied therein for calibrating size of flowable material dots applied onto a workpiece surface, the computer readable program code means in the article of manufacture comprising computer readable program code means for practicing the aforementioned steps of calibrating flowable material dot size.

Another related aspect provides a program storage device readable by a machine, tangibly embodying a program of instructions executable by the machine to perform the aforementioned method steps for calibrating size of flowable material dots applied onto a workpiece surface.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-8 of the drawings in which like numerals refer to like features of the invention. Features of the invention are not necessarily shown to scale in the drawings:

The apparatus and method of the present invention enables the dispensing of small dots and lines of conductive paste or other flowable material onto a workpiece such as a ceramic greensheet, and permits both personalization of the greensheet as well as repair of a previously personalized greensheet. The advantages over prior art dispense techniques include the ability to dispense smaller size dots of flowable material, e.g., less than 50 microns in diameter, as well as the ability to dispense high viscosity flowable materials that have a propensity to dry and clog the nozzle orifices. Typically, the conductive paste comprises copper and binder material. Although the operation of the present invention will be described herein with respect to a conductive, adhesive paste, it may be used with various higher viscosity fluids or other flowable materials that require deposition on workpiece surfaces or openings.

In its preferred embodiment, the present invention utilizes a pressurized paste chamber that is composed of an upper guide bushing and a lower orifice bushing. An integral punch has a larger guide diameter in the shaft portion and a smaller punch or tip diameter in the head portion. These shaft and head portions each have tight, sliding clearances through the guide bushing and orifice bushing, respectively, and provide the upper and lower seals for the paste chamber. During use, the punch is activated up and down so that as the punch tip is retracted up into the paste chamber and out of the orifice of the bushing, the pressurized paste fills the void left by the punch and covers the hole of the orifice. The pressure of the paste is such that there is not enough pressure to extrude the paste out of the orifice but only enough to fill the void and cover the hole of the orifice. The punch is then lowered through the orifice bushing with the tip of the punch pushing a slug of paste through the orifice opening. The punch movement is stopped with the punch tip slightly above the top surface of the ceramic greensheet so that only the paste contacts the sheet. Because the surface tension of the greensheet is greater than that of the punch tip, the paste transfers to the sheet. The punch is then retracted and the process can be repeated. When sitting idle the punch is positioned such that the tip of the punch is flush with the bottom of the orifice. This allows the orifice and punch tip to be wiped clean of any residual paste and also seals the paste chamber to prevent premature drying of the paste.

Figure 1:
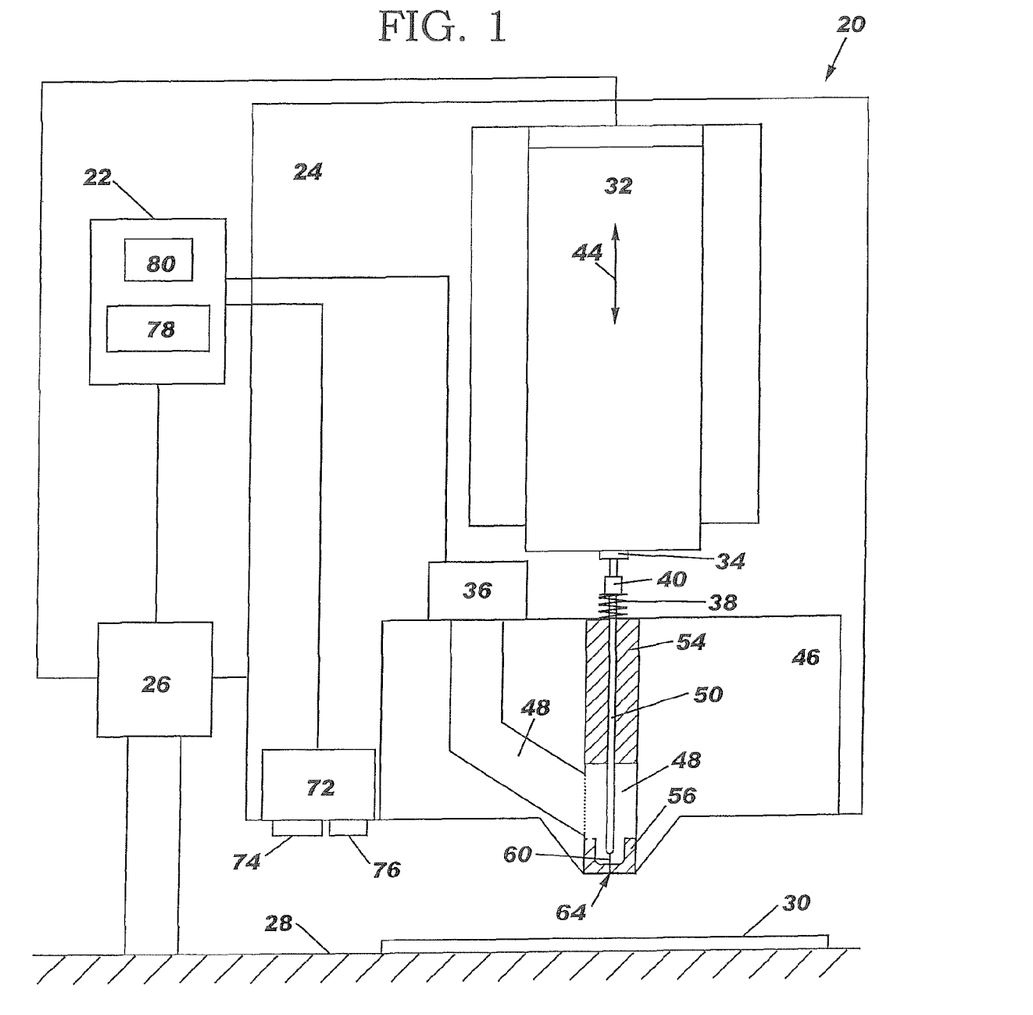
FIG. 1 is an elevational view, partially in cross section, of the preferred apparatus of the present invention for dispensing dots of a conductive paste onto a greensheet.

The preferred apparatus and system of the present invention 20 is depicted in FIG. 1. Workpiece 30, here comprising a ceramic greensheet, is secured on workpiece holder or base 28. A frame 24 holds a computer controlled linear stage 32, which is operatively connected to a stage controller 26. At the lower end of frame 24 is the paste dispense head 46 which includes punch bushings or dies 54, 56 and paste chamber 48. Frame 24 and dispense head 46 are connected to an x-y-z-z translation stage control 26, which permits movement of the dispense head 46 horizontally in the x- and y-directions and vertically in the z-direction, over and with respect to greensheet 30, in addition to controlling the motion of the punch assembly 40. A pressurized air source 36, is used to control the pressure of the paste in the paste chamber 48. A computer controller 22 coordinates the operation of translation stage control 26 and air pressure source 36.

A plunger 34 extends downward from linear stage 32 and secures a punch assembly 40, while return spring 38 retracts the punch assembly. Operation of linear stage 32 enables the plunger, punch assembly and spring to move vertically up and down in direction indicated by arrow 44. Computer controller 22 permits infinite control of the movement of the punch assembly between upper, intermediate and lower positions. Extending downward from punch assembly 40 is punch shaft 50 and, at the lower end thereof, punch head 60. Punch shaft 50 slides vertically through an opening in upper guide bushing or die 54; the clearances between the punch shaft diameter and the guide bushing bore diameter are preferably such that a tight sliding fit is created which permits vertical movement, yet provides a substantial sealing of the paste within paste chamber 48 below. Punch head 60 travels vertically downward through paste chamber 48 and through bore or opening 64 in a lower orifice member or bushing 56. Orifice 64 diameter may be 72 microns or less, to enable small diameter dots of paste to be deposited on the greensheet. As with the punch shaft and upper guide bushing, the difference in diameter between punch head 60 and orifice bore 64 is preferably such that a tight sliding fit is created, which also enables substantial sealing of the paste chamber 48 above. Paste chamber 48 has a larger diameter or width than the diameter or width of orifice bore 64.

Figure 2:
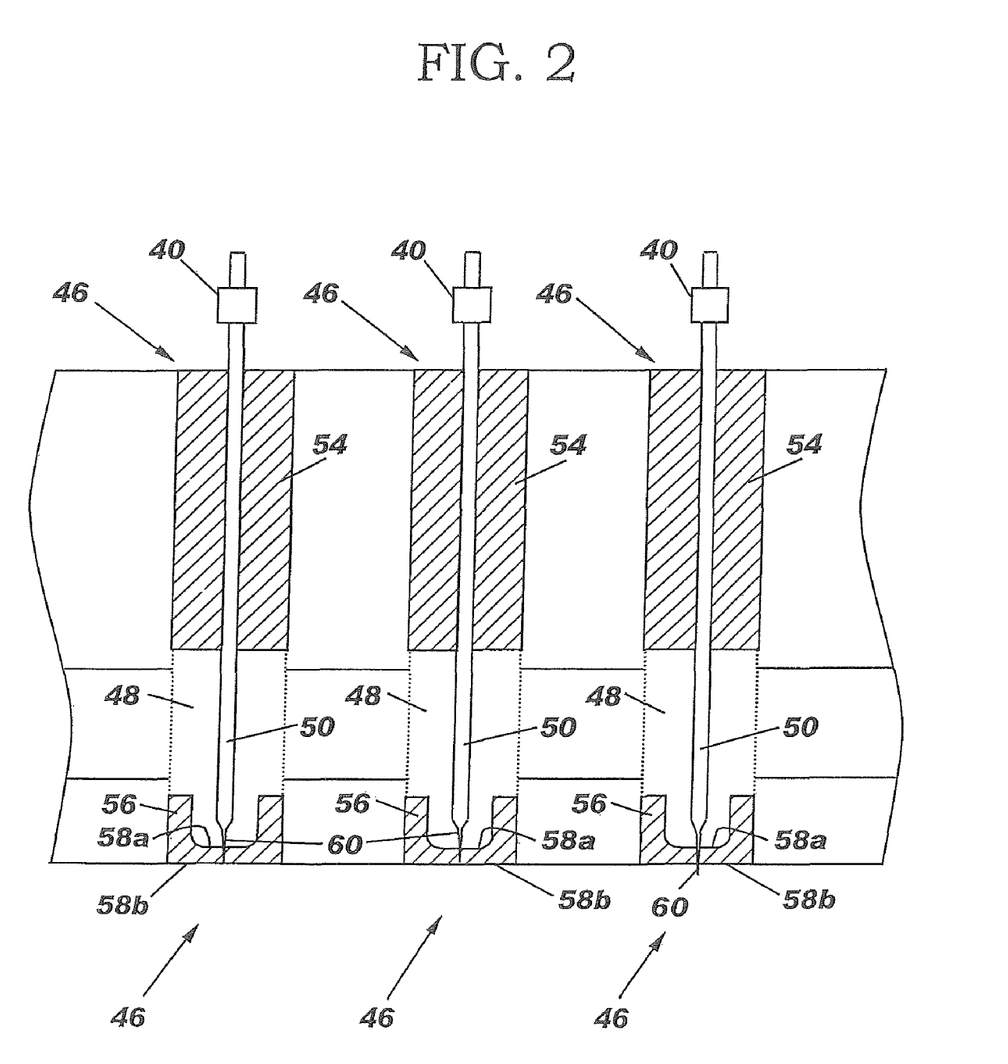
FIG. 2 is an elevational view, in cross section, of a gang of paste dispensing heads in accordance with the present invention.

The dispense head and punch assembly are shown in more detail in the different operational positions in FIG. 2. Three punch heads 46 are shown connected to form a punch head gang which enables simultaneous or sequential deposition of three dots of conductive paste. The three dispense heads 46 are shown in the three different positions for purposes of illustration, although they may be operated simultaneously in the same positions. The left dispense head is shown in the park or idle position, where the punch assembly is normally maintained when the dispense head is not being used. The middle dispense head shows the punch assembly in the retract position, where the punch tip is moved to an upper position, which permits the paste in paste chamber 48 to be flowed onto the lower face of the punch tip. The right dispense head shows the punch assembly in the dispense position, where the punch tip is in the lower most position to transfer paste onto the greensheet. Prior to initiating dispensing of the dots of conductive paste on the greensheets, a priming sequence may be utilized which comprises repeatedly moving the punch between the idle position and the retracted position to prepare the dispense head for use.

Figure 3A:
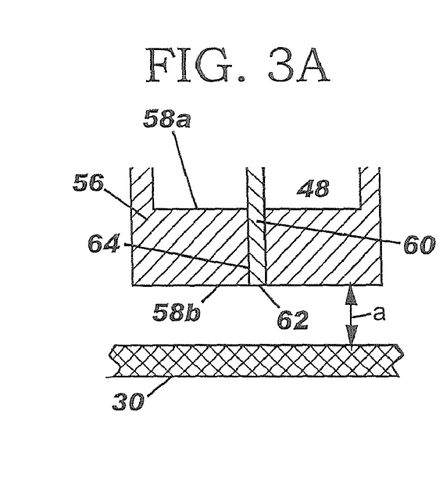
FIGS. 3a-3f are cross sectional views of the sequence of the punch dispensing a dot of conductive paste from the dispensing head onto the surface of a greensheet.
Figure 3B:
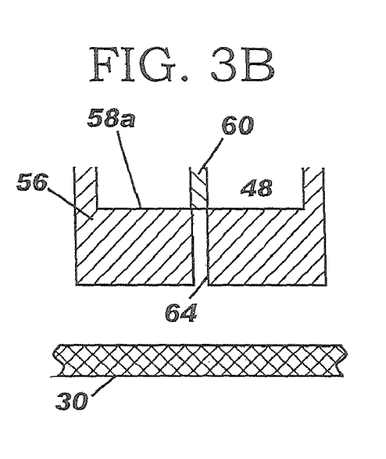
Figure 3C:
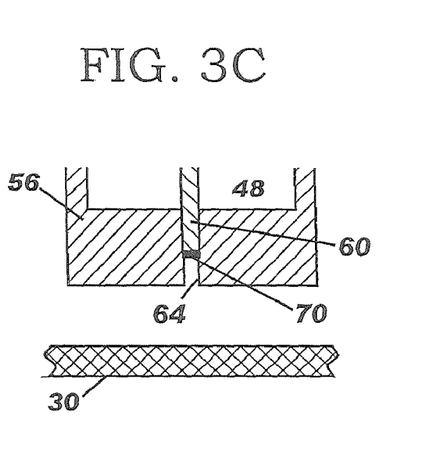
Figure 3D:
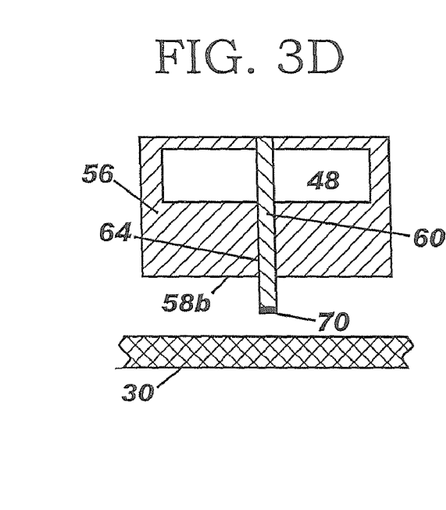

FIGS. 3a-3f illustrate the sequential operation of the apparatus depicted in FIGS. 1 and 2. In the initial idle position shown in FIG. 3a, punch face 62 is coplanar with the lower surface 58b of orifice bushing 56. Because of the tight clearance between punch tip 60 and orifice bore 54, the paste in paste chamber 48 is substantially sealed at the lower end thereof. The lower face 58b of orifice bushing 56 is positioned by the x-y-z-z translation control to be a desired distance a above the surface of greensheet 30. As shown in FIG. 3b, and also in more detail in FIG. 4, punch 60 is initially retracted upward into the paste chamber so that punch face 62 is a desired distance c above the upper surface 58a of orifice member 56. The distance c of punch face 62 above bore 64 is sufficient to permit a desired amount of conductive paste 70 to flow onto the vicinity of the punch face. Punch chamber 48 is pressurized, and the amount of pressure is selected to permit the flowing of paste 70 onto the punch face, without substantial amount of the paste flowing downward into orifice bore 64. Thereafter, the linear stage 32 is activated to push the punch assembly 40 and punch tip 60, along with the paste 70 on the punch face 62, downward into and through orifice bore 64 as shown in FIG. 3c. The movement of punch 60 continues downward, as shown in FIG. 3d, so that the punch tip emerges from below the lower surface 58b of the orifice member 56.

Figure 3E:
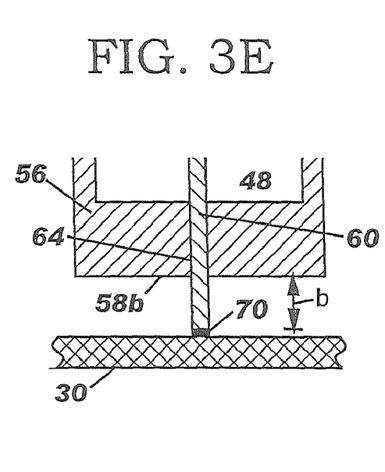
Figure 3F:
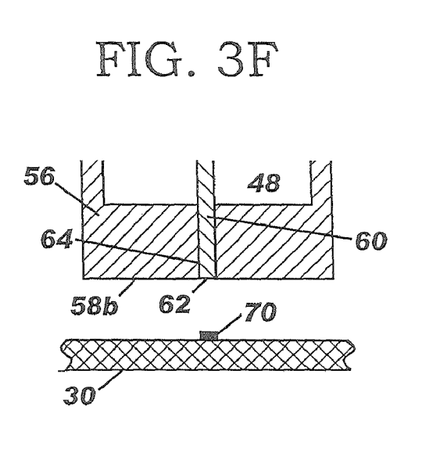
Figure 4:
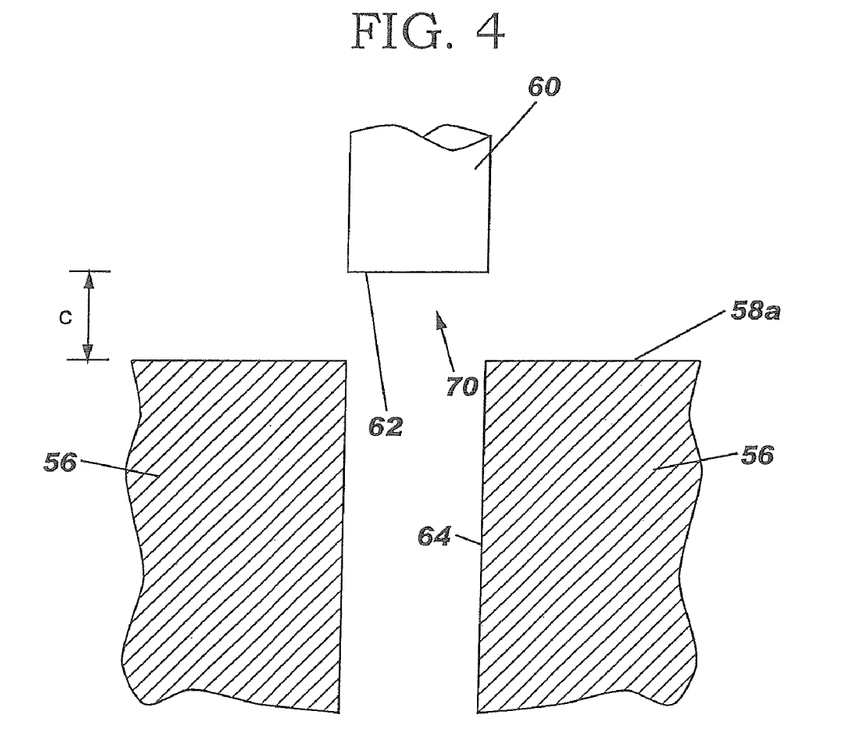
FIG. 4 is a close-up view of the punch in a retracted position in the paste chamber, as shown in FIG. 3b.

As shown in FIG. 3e, the travel of punch 60 is controlled until it reaches a desired distance b from the bottom of orifice member 56 and conductive paste 70 contacts the upper surface of greensheet 30. Preferably, punch face 62 does not contact the greensheet surface as the dot of conductive paste is deposited and transferred. The conductive paste 70, in the form of a dot, is deposited on the greensheet surface as a result of the difference in surface tension between the greensheet surface 30 and the punch face 62, as punch tip 60 is retracted upward. A typical amount of flowable material 70 on the punch face 62 is 50 picoliters and the diameter of conductive paste is less than 50 microns. The process of the steps shown in FIGS. 3b-3e may be repeated to deposit a desired amount of separate paste dots 70, and the dispense head may be moved by the xyz controller 36 as desired between the deposition of the different paste dots. As shown in FIG. 3f, following the desired deposition of paste dots, the punch is retracted again to its idle position such that the punch face 62 is substantially coplanar with lower surface 58b of the orifice, as preciously shown in FIG. 3a. In this position any residual paste may be cleaned from the punch face and orifice surface 58b by wiping or spraying with a cleaner.

During the continuous and repeated operation, the distance c of punch face 62 while in the retracted position may be infinitely adjusted, to provide for different amounts of conductive paste 70 flowing thereunder. Likewise the distance b that the punch 60 extends out of orifice member 56 may be infinitely adjusted between deposition of the conductive paste dots to provide for the different amounts or different diameters of the conductive paste in the dots. The lower and upper stops to control the distances b and c, respectively are set through the stage controller for linear stage 32, as well as the position of the punch in the idle position.

The system 20 of the present invention preferably also includes a sensor system 72 which incorporates a distance sensor 74, for measuring the distance a from the dispense head to the greensheet, as well as a vision system for measuring the size, e.g. diameter and height, of the dots of conductive paste deposited on the greensheet. The distance a is preferably measured continuously during the dot deposition process.

As the dots of conductive paste 70 are deposited on the greensheet, vision sensor 76 measures the size of each of the dots, most preferably dot diameter. As the size of the different deposited dots is measured, the system preferably determines the average size of the dots on the workpiece surface, the difference in size between the largest and smallest dots on the workpiece surface, and the rate of change of the size of the dots on a workpiece surface. As these determinations are made, the parameters for dispensing the conductive paste may be modified based on these determinations. These parameters include among other things, the pressure in the paste chamber, the upper and lower stops for the travel of punch assembly 44, which determine distances a (between the dispense head and the greensheet surface), and distance b (amount of extension of the punch head out of the dispenser head), and distance c (spacing of the punch face into the punch chamber). In calibrating the size of the dots, a calibration score may be assigned, based on the determination of the rate of change of the size of the dots, the average size of the dots, or the difference in size between the smallest and largest dots on the workpiece surface.

Figure 5:
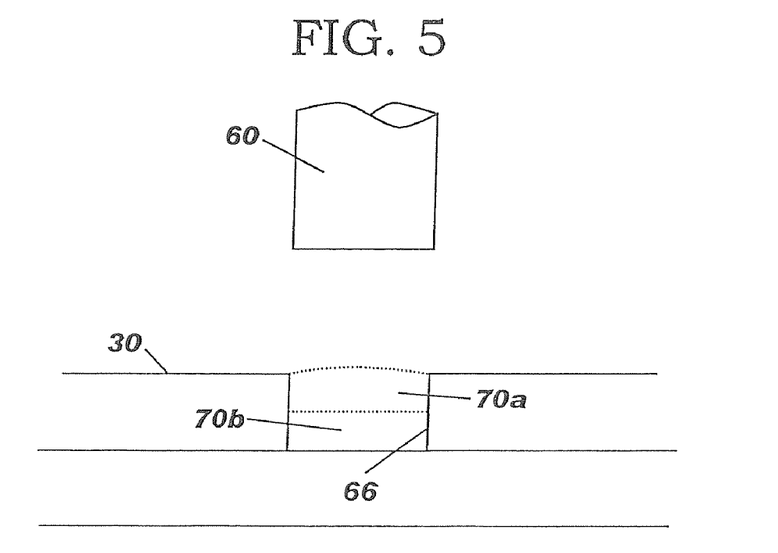
FIG. 5 is a side elevational view showing a cross section of a via in a greensheet being filled with successive layers of conductive paste deposited by the punch head.
Figure 6:
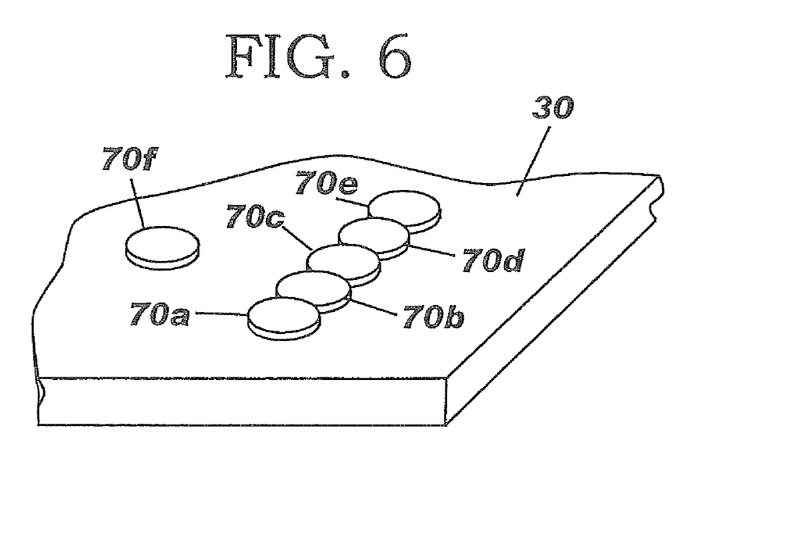
FIG. 6 is a perspective view of a line of conductive paste formed by the sequential deposition of a plurality of paste dots on the surface of a greensheet.
Figure 7:
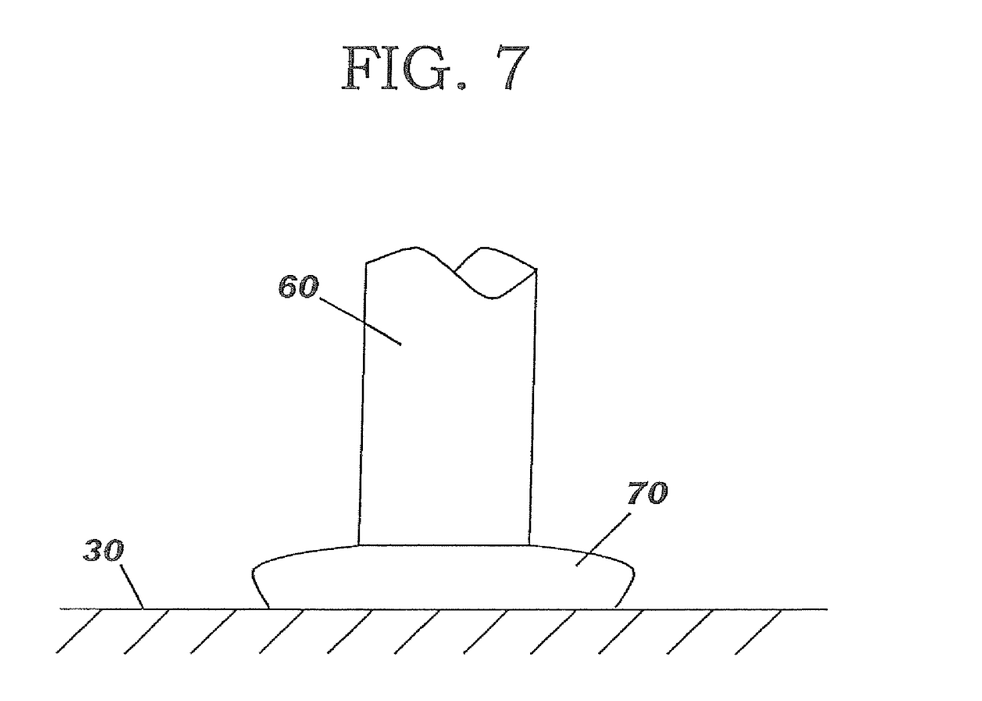
FIG. 7 is an elevational view showing the punch head controlling the diameter of a dot of conductive paste by the distance of the punch head from the greensheet surface.

Lines as well as dots can be dispensed by stitching dots together with a slight overlap. By knowing the size of the dots, the pitch from dot to dot required for a smooth line can be easily calculated. Similar to the dots, these lines can be built up on top of each other to achieve the desired line height. This can all be done automatically by adjusting the stroke of the punch for subsequent passes. FIG. 5 shows punch tip 60 depositing conductive paste into a via 66 in greensheet 30. Because of the depth of the via, several successive layers of conductive paste dots 70a, 70b, are deposited on top of each other to build up the dot height and substantially fill the via. FIG. 6 illustrates the depositing of either a separate, single dot of conductive paste, 70f, spaced-apart from other dots, or the overlap depositing of successive dots adjacent to and in contact with each other, 70a, 70b, 70c, 70d and 70e, to form a line on greensheet 30. The diameter of the conductive dots can also be controlled as shown in FIG. 7 wherein the punch tip 60 is extended downward closer to the surface of greensheet 30, to spread out and increase the diameter of conductive paste dot 70.

The preferred method of operation of the present invention includes the use of several programmable parameters that allow for total control of the dot size being dispensed. These parameters are adjusted through a closed loop system that can adjust for any variations in paste viscosity and greensheet height relative to the dispense head. This closed loop system contains calibration software that will automatically adjust all critical parameters to give any desired dot size. The control of these critical parameters is fully automated such that successive dots can be placed with different desired sizes. The control of these parameters also allows dots to be stacked on top of each other to give dots and lines of varying heights as well as via holes in the greensheet to be filled with paste. There is also a "priming" sequence that can be done automatically after the tool has been sitting idle that consists of cycling the punch up into the paste chamber and back down to its flush position (idle position). This can be done several times depending on the time the dispense head has been sitting idle and can be tied to the control system that is capable of keeping track of how long the head has been sitting idle.

The closed loop system consists of four main parts. The first part is the dispense head with an integral programmable dispense head assembly and workpiece holder or stage for moving the punch up and down with respect to the stage, as well as a programmable pressure regulator for setting the paste chamber pressure, as described above. The dispense head assembly and/or stage have dynamically adjustable position stops to accurately set the stroke of the punch as well as having as many position stops as desired. The second part of the system consists of a sensor to measure the height of the greensheet relative to the dispense head at the location the dot is going to be placed, as described above. This is preferably a non-contact measurement device using a laser displacement sensor or equivalent, such as one available from Keyence. The third part of the system is a vision system, such as a Cognex vision system, capable of measuring the diameters of the dots dispensed as well as the heights, also as described above. The fourth and final part of the closed loop system is the computer software tying all the parts together. Preferably, this software not only controls all the adjustable parameters and reading measurements from the other parts of the system, but it also automatically adjusts the parameters of the system to dispense dots of a required size. This auto calibration software consists of algorithms that form an iterative process of dispensing dots, measuring and analyzing the dots, and making adjustments to certain parameters in order to obtain the size of the dots required.

Preferably, the first step in analyzing the measured dots is to ensure that all the dots being analyzed are present. If not, adjustments are made to guarantee that all dots are present. It is also noted whether or not the first dot dispensed is present, the smallest dot, or the largest dot since this can lead to a different set of adjustments. The preferred second step is to determine the slope of the best fit line to the dot size data. In addition, a normalized slope is also determined by calculating the slope of a best fit line ignoring the 1st dot. This information is used to determine if the dots are getting larger or smaller at a rate that could yield unsatisfactory dots if the maximum number of dots per sheet were dispensed. (This number is typically larger than the number of dots being dispensed for calibration.) The preferred third step is to determine the average dot size of the dots being analyzed. In addition to the average size, a normalized average is also determined by disregarding the smallest and largest dots. This information will be used to make adjustments so that the average dot size is within acceptable limits of the desired dot size. The fourth preferred step is to determine the consistency of the dots being dispensed. This is done by noting the smallest dot size as well as the largest dot size. This low-high spread is required to be within acceptable limits of the desired size. If the first four steps are passed successfully, the preferred fifth and final step is to assign a calibration score that is indicative of the accuracy of the calibration. During this iterative calibration process, a time stamped log file is kept to record the data from each iteration as well as the adjustments that are being made to the dispense head for each iteration.

Figure 8:
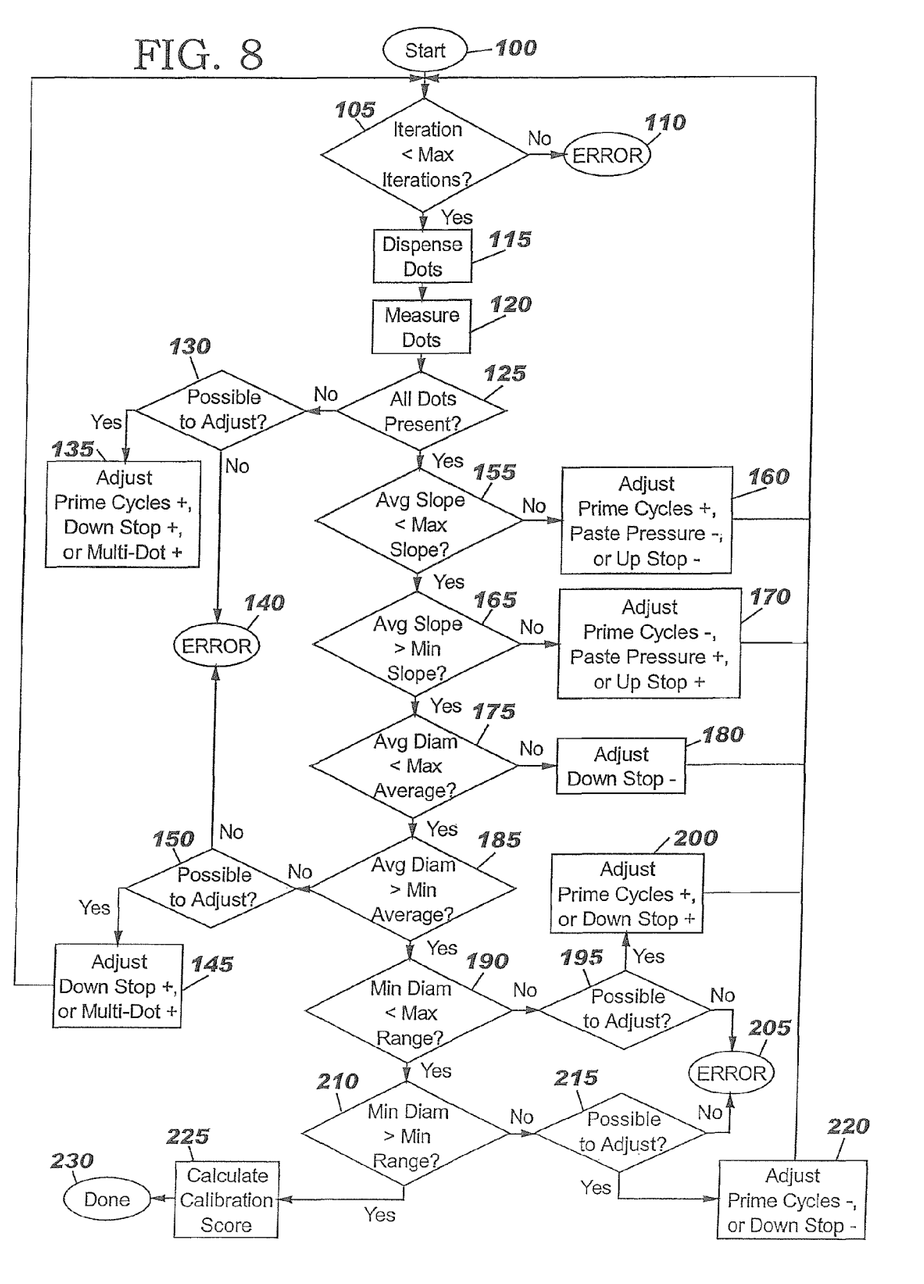
FIG. 8 is a flow diagram illustrating the preferred steps of the calibration routine employed in the preferred embodiment of the present invention to measure and control the size of the dot of paste deposited on a greensheet.

As shown in the flow chart of FIG. 8, the auto-calibration routine starts, 100, by first determining whether the number of iterations in the process is below the maximum set, 105. If not below the maximum, an error 110 is recorded. If it is below the maximum iterations, the system dispenses the dots as described above, 115, and the vision sensor measures the dots, 120. The system then determines whether all dots desired to be measured are present, 125. If not, if it is possible to adjust 130, an adjustment to the system parameters is made, 135, and the routine again commences, 100. If it is not possible to adjust, error message 140 is displayed. Assuming that all dots are present, the rate of change of size of the dots is determined by determining the slope of the line representing the difference in slope between successive dots on a graph. If the average slope is less than the maximum slope 155, the system proceeds. If not, adjustments of the various parameters are made, 160, and the routine again commences, 100. If the average slope of the line is greater than the minimum slope 165, the system also proceeds. If not, adjustment of the system parameters are made, 170, and the routine again commences, 100. The average diameter of the dots is then determined. First it is determined whether the average diameter is less than the maximum average, 175. If it is not, the adjustment is made to the down stop which adjusts punch extension dimension b (FIG. 3e), 180, and the routine again commences, 100. If yes, the average diameter is checked to determine if it is larger than the minimum average, 185. If not, it is determined whether it is possible to adjust, 150. If it is not possible, an error message 140 is displayed. If it is possible an adjustment is made to the down stop or the number of dots dispensed on top of each other 145, and the routine again commences, 100. If the average diameter is greater than the minimum average, it is determined whether the minimum diameter is greater than the minimum range, 190. If not, it is determined whether or not it is possible to adjust, 195. If it is possible to adjust, adjustment is made to the prime cycle or down stop, 200, and the routine again commences, 100. If it is not possible to adjust, error message 205 is displayed. If the minimum diameter is greater than the minimum range, maximum diameter is checked to determine if it is less than the maximum range, 210. If not it is determined whether or not it is possible to adjust, 215. If not possible to adjust an error message 205 is displayed. If it is possible to adjust, an adjustment is made to the prime cycle or down stop, 220, and the routine again commences, 100. If the maximum diameter is less than the maximum range, there is a calculation made with the calibration score, 225, and the routine is ended, 230.

The method of the present invention for calibrating size of the dots of conductive paste applied onto the greensheet may be implemented by a computer program or software incorporating the process steps and instructions described above in otherwise conventional program code and stored on an otherwise conventional program storage device. As shown in FIG. 1, the program code, as well as any input information required, may be stored in computer 22 on program storage device 78, such as a semiconductor chip, a read-only memory, magnetic media such as a diskette or computer hard drive, or optical media such as a CD or DVD ROM. Computer system 22 has a microprocessor 80 for reading and executing the stored program code in device 78 in the manner described above.

The controllable fixed parameters of the preferred system of the present invention are shown as follows in Table 1. These parameters preferably reside in a configuration file that can be updated.

TABLE 1

| Parameter | Description |
| --- | --- |
| maximum_iterations | maximum allowable iterations when performing calibration |
| number_of_dots | number of dots to dispense during each calibration iteration |
| dots_to_skip | number of initial dots to skip for analyzing |
| x_dispense_location | location of X-axis on sheet to perform calibration |
| y_dispense_location | location of Y-axis on sheet to perform calibration |
| minimum_up_stop | minimum allowable value of up stop for dispense head punch |
| maximum_down_stop | maximum allowable value of down stop for dispense head punch |
| minimum_paste_pressure | minimum allowable value for paste chamber pressure |
| maximum_paste_pressure | maximum allowable value for paste chamber pressure |
| maximum_multi_dot | maximum allowable value for number of multi-dots |
| maximum_priming_cycles | maximum allowable value for number of priming cycles |
| desired_diameter | target diameter of dispensed dots (microns) |
| slope_minimum | minimum acceptable slope value for best-fit line analysis |
| slope_maximum | maximum acceptable slope value for best-fit line analysis |
| average_delta_max | maximum acceptable range of average_diameter referenced to desired_diameter (+/− microns) |
| diameter_range_maximum | maximum acceptable range of smallest_dot and largest_dot referenced to desired_diameter (+/− microns) |
| single_max_window | maximum acceptable range of a single dot referenced to desired_diameter (+/− microns) |

The calculated parameters of the preferred system of the present invention are shown as follows in Table 2.

TABLE 2

| Parameter | Description |
| --- | --- |
| sheet_height | measured value of sheet height at calibration location |
| best_fit_slope | calculated slope of best-fit line to measured dot diameter data |
| average_diameter | calculated value of average measured dot diameter (microns) |
| smallest_dot | measured value of smallest dot diameter (microns) |
| largest_dot | measured value of largest dot diameter (microns) |
| normal_average_diameter | calculated value of average diameter disregarding the smallest_dot and the largest_dot |
| normal_slope | calculated value of best-fit line to measured dot diameter data disregarding the 1st dot |
| number_lo_dots | # of dots < (desired_diameter − diameter_range_maximum) |
| number_hi_dots | # of dots > (desired_diameter + diameter_range_maximum) |
| down_stop_delta | calculated amount to adjust down_stop |
| single_dot_lo | software flag to signal a single dot is out of lo range |
| single_dot_hi | software flag to signal a single dot is out of hi range |

The adjustable dispense head parameters of the preferred system of the present invention are shown as follows in Table 3. These parameters also preferably reside in a configuration file that can be updated, and may be accessed for adjustment of the dispense head during calibration.

TABLE 3

| Parameter | Description |
| --- | --- |
| priming_cycles | number of priming cycles to perform prior to dispensing dots after sitting idle |
| down_stop | value of stroke limit in the down direction for dispense head punch during dot dispensing |
| up_stop | value of stroke limit in the up direction for dispense head punch during dot dispensing |
| paste_pressure | value of paste chamber pressure |
| multi_dot | number of repetitions to perform when dispensing a dot |
| multi_dot_delta | value of down_stop delta between successive repetitions when dispensing a dot with multi_dot > 1 |

The miscellaneous dispense head parameters of the preferred system of the present invention are shown as follows in Table 4. These parameters, although not adjusted during calibration, also preferably reside in a configuration file that is accessible so that they can be manually adjusted as needed.

TABLE 4

| Parameter | Description |
| --- | --- |
| idle_position | value of dispense head punch position when dispense head is sitting idle |
| prime_down | value of stroke limit in the down direction for dispense head punch during priming cycles |
| prime_up | value of stroke limit in the up direction for dispense head punch during priming cycles |
| dispense_speed | speed of dispense head punch during dot dispensing |
| up_dwell | amount of time to dwell after moving dispense head punch to up_stop |
| down_dwell | amount of time to dwell after moving dispense head punch to down_stop |

With a stripper bore diameter of 63 µm, and a punch head diameter of 50 µm, paste dots of 40-80 µm diameter are achievable. The stripper bore and punch head diameters may be sized higher or lower to provide greater or smaller paste dot diameters, respectively. Thus, the method and system of the present invention provides for the dispensing of flowable paste in a manner which enables smaller size dots or lines of paste to be created on the greensheet and for controllable and repeatable dot sizes. The present invention also reduces the problems of clogged nozzles in dispensing conductive paste onto a greensheet. The apparatus of the present invention may further be made at considerably lower cost than a custom made paste dispensing equipment by modifying components used to punch holes in greensheets.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of calibrating size of flowable material dots applied onto a workpiece surface comprising:
dispensing flowable material in the form of separate, spaced-apart dots onto a workpiece surface;
measuring the size of the dots on the workpiece surface;
determining rate of change of the size of the dots on the workpiece surface;
determining average size of the dots on the workpiece surface;
determining difference in size between dots on the workpiece surface; and
adjusting parameters for dispensing the flowable material onto the workpiece surface based on one or more of the determinations of rate of change of the size of the dots, average size of the dots and difference in size between smallest and largest dots on the workpiece surface.

2. The method of claim 1 further including assigning a calibration score based on the determinations of rate of change of the size of the dots, average size of the dots and difference in size between smallest and largest dots on the workpiece surface.

3. The method of claim 1 wherein the flowable material is a conductive, adhesive paste and the workpiece is a ceramic greensheet.

4. The method of claim 1 further including continuously repeating the dispensing of the desired amount of flowable material onto the workpiece a plurality of times.

5. The method of claim 1 further including repeating the dispensing of the desired amount of flowable material onto a previously deposited amount of flowable material to create a desired height of flowable material on the workpiece.

6. The method of claim 1 wherein the flowable material is a conductive paste, the workpiece is a ceramic greensheet and the workpiece surface is a via opening in the ceramic greensheet, and including dispensing the desired amount of flowable conductive paste into the via opening.

7. The method of claim 1 wherein the flowable material is a conductive paste and the workpiece is a ceramic greensheet, and including repeatedly depositing desired amounts of flowable conductive paste adjacent previously dispensing amounts of flowable material to create a line of conductive paste on the ceramic greensheet.

8. The method of claim 1 wherein parameters for dispensing the flowable material onto the workpiece surface are adjusted based on determinations of rate of change of the size of the dots.

9. The method of claim 1 wherein parameters for dispensing the flowable material onto the workpiece surface are adjusted based on average size of the dots.

10. The method of claim 1 wherein parameters for dispensing the flowable material onto the workpiece surface are adjusted based on difference in size between smallest and largest dots on the workpiece surface.

* * * * *